(12) United States Patent
Neiser

(10) Patent No.: US 10,935,010 B2
(45) Date of Patent: Mar. 2, 2021

(54) VOLTAGE CONVERSION APPARATUS AND METHOD

(71) Applicant: Paul Neiser, Mountain View, CA (US)

(72) Inventor: Paul Neiser, Mountain View, CA (US)

( * ) Notice: Subject to any disclaimer, the term of this patent is extended or adjusted under 35 U.S.C. 154(b) by 0 days.

(21) Appl. No.: 16/452,518

(22) Filed: Jun. 25, 2019

(65) Prior Publication Data

US 2019/0390661 A1    Dec. 26, 2019

Related U.S. Application Data

(60) Provisional application No. 62/763,638, filed on Jun. 25, 2018.

(51) Int. Cl.
*F03G 7/08* (2006.01)
*H01L 35/30* (2006.01)
*H02J 15/00* (2006.01)
*H02N 3/00* (2006.01)

(52) U.S. Cl.
CPC ............. *F03G 7/08* (2013.01); *H01L 35/30* (2013.01); *H02J 15/00* (2013.01); *H02N 3/00* (2013.01)

(58) Field of Classification Search
CPC .. F03G 7/08; H02N 3/00; H01L 35/30; H01L 29/68; H01L 43/00
See application file for complete search history.

(56) References Cited

U.S. PATENT DOCUMENTS

| | | | |
|---|---|---|---|
| 3,790,829 A | 2/1974 | Roth | |
| 5,441,576 A * | 8/1995 | Bierschenk | H01L 35/08 136/203 |
| 5,738,731 A * | 4/1998 | Shindo | B81C 1/0038 136/249 |
| 7,170,112 B2 | 1/2007 | Ning | |
| 2005/0056311 A1* | 3/2005 | Son | H02S 10/30 136/205 |
| 2016/0359212 A1 | 8/2016 | Houle | |
| 2017/0287977 A1 | 10/2017 | Moroz | |
| 2018/0323359 A1 | 11/2018 | Li et al. | |
| 2019/0186786 A1* | 6/2019 | Neiser | F24V 50/00 |

FOREIGN PATENT DOCUMENTS

WO     2016191606     12/2016

* cited by examiner

*Primary Examiner* — William Coleman
(74) *Attorney, Agent, or Firm* — Chhabra Law Firm, PC

(57) ABSTRACT

A body force per unit mass acting on mobile charge carriers within a first electrically conducting material is configured to induce at least one region of accumulation of charge within at least a portion of the first material. The magnitude of the associated change in the voltage between two given points within the first material is a function of the relevant electrical properties of the material. A second electrically conducting material can be electrically coupled to the first material via a first electrical contact. The relevant electrical properties of the second material can be configured to be different to the relevant electrical properties of the first material. The voltage difference between the two points in the first material can be different to the voltage difference between two equivalent points in the second material. The difference in the voltage difference can be employed to increase the voltage of mobile charge carriers within a portion of an open or closed electrical circuit relative to another portion of said circuit. A voltage conversion apparatus and method can be used to convert thermal energy into electrical energy, for example.

40 Claims, 2 Drawing Sheets

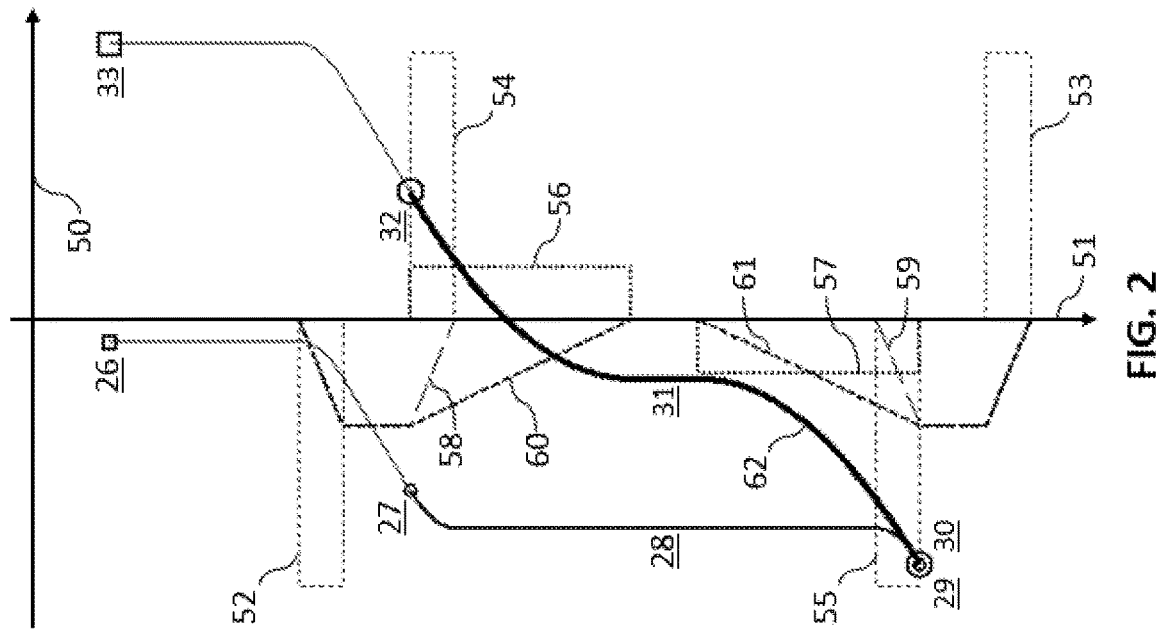
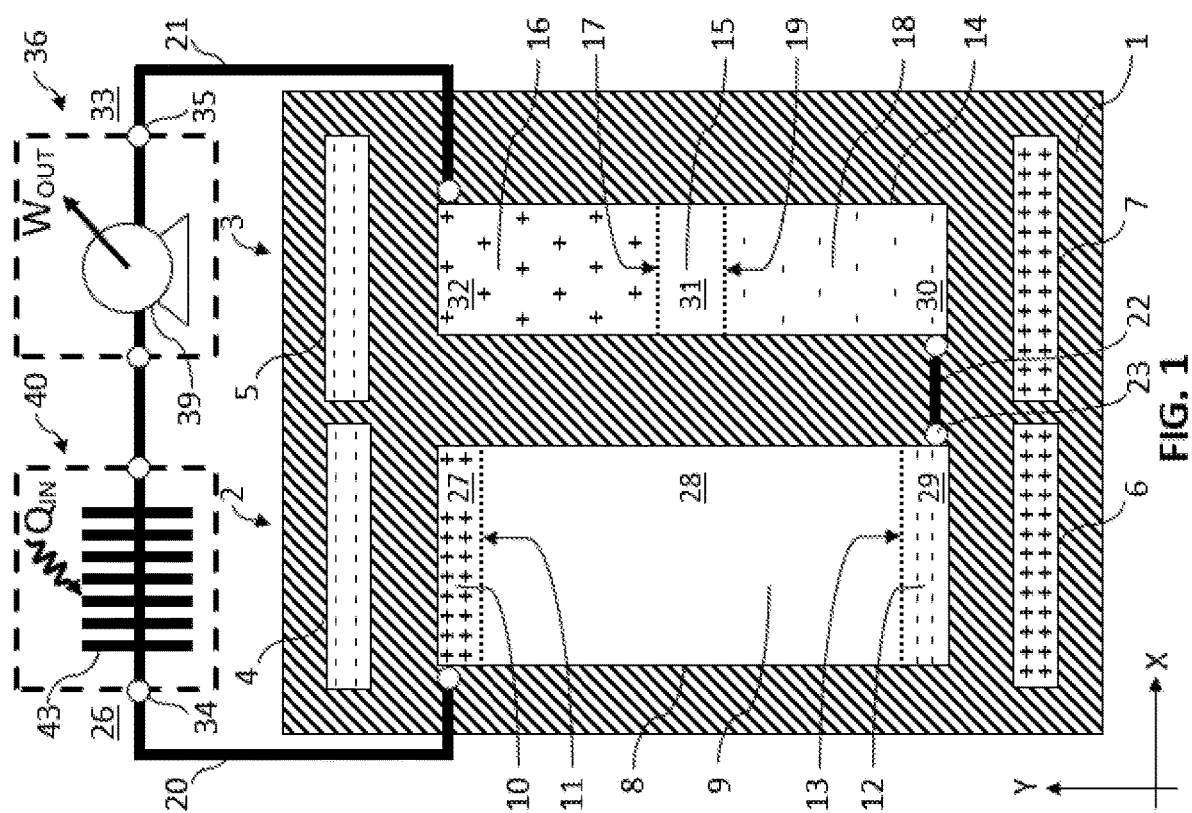
FIG. 1
FIG. 2

VOLTAGE CONVERSION APPARATUS AND METHOD

CLAIM OF PRIORITY

The present patent application is a non-provisional of, and claims the benefit of priority of U.S. Provisional Patent Application No. 62/763,638 filed on Jun. 25, 2018, which is hereby incorporated by reference herein in its entirety.

FIELD

The invention relates to apparatuses and methods for modifying the potential energy of mobile charge carriers.

BACKGROUND

In conventional voltage conversion apparatuses, such as voltage regulators, or DC-DC converters, the output power is typically less than or equal to the input power.

In conventional thermoelectric generators, a difference in temperature between a first thermal reservoir and a second thermal reservoir is required in order to convert thermal energy into electricity.

SUMMARY

Provided is an apparatus and method for voltage conversion. A body force per unit mass acting on mobile charge carriers within a first electrically conducting material is configured to induce at least one region of accumulation of charge within at least a portion of an electrically insulated portion of the first material. A region of accumulation of charge can be positively or negatively charged, and can comprise a depletion or an accumulation of mobile charge carriers. The first material can comprise a first electrical contact and a second electrical contact, where the first electrical contact is at a different voltage than the second electrical contact. At least a portion of the voltage difference between the first and second contact can be associated with a region of accumulation of charge. The magnitude of the change in the voltage between two given points within the first material is a function of the relevant electrical properties of the material.

A second electrically conducting material can be electrically connected to the first material via the first electrical contact. The relevant electrical properties of the second material can be configured to be different to the relevant electrical properties of the first material. The voltage difference between the first and second electrical contact in the first material can, at least in theory, be different to the voltage difference between two equivalent points in the second material. This difference in the voltage difference can be employed to increase the voltage of mobile charge carriers within a portion of an open or closed electrical circuit relative to another portion of said circuit.

In analogy to the depletion of mobile charge carriers at the interface of a p-type and n-type semiconductor, a region of accumulation of charge is referred to as a "depletion region" herein. Note that a depletion region, as used herein, can also comprise an accumulation of mobile charge carriers.

The set of relevant electrical properties can comprise the number of donor atoms per unit volume within a material, where a donor atom can donate a mobile charge carrier, such as an electron, and become positively charged, or ionized, in the process. The set of relevant electrical properties can comprise the number of acceptor atoms per unit volume within a material, where an acceptor atom can accept a mobile charge carrier, such as an electron, and become negatively charged, or ionized, in the process. An acceptor atom can also be considered to be a donor of a hole. Note that a "hole" is a quasiparticle which is positively charged, as described in the field of semiconductors.

The set of relevant electrical properties can comprise the nominal number of mobile charge carriers per unit volume within a material. For example, the set of relevant electrical properties can comprise the number of free electrons, or the number of conduction electrons, per unit volume within a material. The nominal case can be the case in which there is no accumulation of net charge within a material, for example. For instance, there are three conduction electrons per atom in a neutrally charged Aluminium, and one conduction electron per atom in neutrally charged copper. The set of relevant electrical properties can comprise the average amount of charge per mobile charge carrier.

The set of relevant electrical properties can comprise the temperature of the material. The set of relevant electrical properties can comprise the absolute permittivity within the material.

The set of relevant electrical properties can comprise a wide variety of other properties for a subset of embodiments, such as the electrical resistivity of a material, the effective mass of mobile charge carriers, or the thermal conductivity of a material.

In general, the set of relevant electrical properties can comprise the length or the extent of a region of accumulation of charge within the specified material along the average path of mobile charge carriers through a region of accumulation of charge, i.e. through the so-called depletion region. This length or extent of the depletion region is referred to as the "thickness" of the depletion region herein. Note that the thickness of the depletion region is also a function of the externally applied electric field. The set of relevant electrical properties are therefore not limited to the properties of a material per se.

The mobile charge carriers can be electrons, holes, or positively or negatively charged ions, for example. The body force per unit mass can be electromagnetic, inertial, or gravitational in nature, for example. The first material can comprise an electrically conducting material, such as a metal, a semiconductor, or a liquid solution comprising positively or negatively charged ions. The first material can also comprise a gas, such as a thermal or nonthermal plasma.

A voltage conversion apparatus and method can be used in electricity generators, voltage amplifiers, or voltage regulators, for example. A voltage conversion apparatus and method can also be employed to convert thermal energy into electricity, for instance. The thermal energy from a single thermal reservoir is sufficient for the generation of electricity.

BRIEF DESCRIPTION OF THE DRAWINGS

The drawings described herein are for illustration purposes only. The drawings are not intended to limit the scope of the present disclosure.

FIG. 1 shows a cross-sectional view of one embodiment of the invention.

FIG. 2 shows a plot of the approximate value of several physical parameters as a function of position.

DETAILED DESCRIPTION OF THE DRAWINGS

Figure 3:
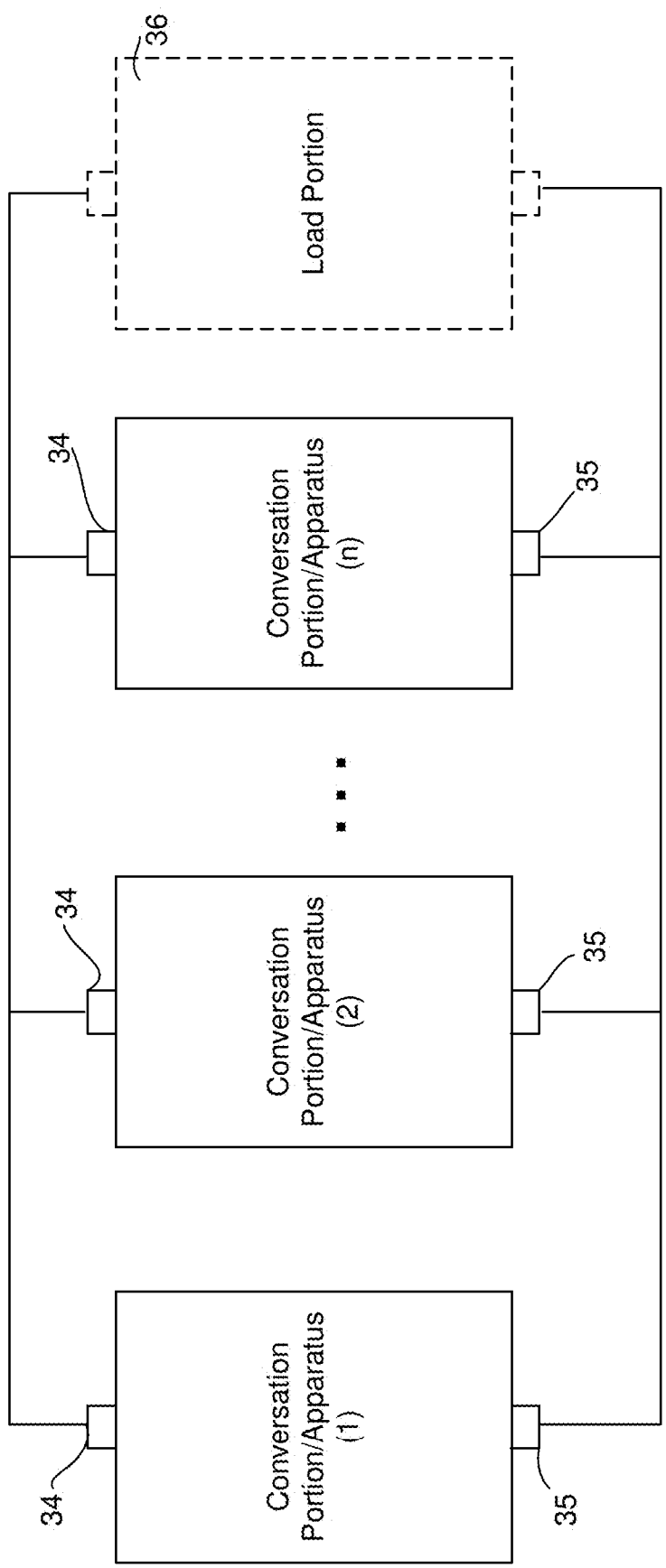
FIG. 3 shows a diagram of a parallel arrangement of the conversion portion/apparatus of FIG. 1, according to embodiment of the invention.

FIG. 1 shows a cross-sectional view of one embodiment of the invention.

Bulk material 1 is an electrical insulator such as glass or a ceramic. Bulk material 1 also provides structural support to the electrical conductors it interfaces with. In other embodiments, bulk material 1 can also be a semiconductor with a low electrical conductivity compared to the other conductors of the embodiment.

The particular embodiment shown in FIG. 1 comprises several collections of negative charge, such as first top charge collection 4, second top charge collection 5, as well as several collections of positive charge, such as first bottom charge collection 6, and second bottom charge collection 7. In other embodiments, the polarity can be reversed, i.e. the top charge collections can be positively charged, and the bottom charge collections can be negatively charged.

Each charge collection, such as charge collection 4, has a rectangular cross-section when viewed along the Y-direction. In other embodiments, a charge collection can have any geometry, such as a square or polygonal cross-sectional geometry when viewed along the Y-direction or the Z-direction. For example, a charge collection can be cylindrical in shape, with a circular cross-section when viewed along the Y-direction.

In the embodiment shown, first top charge collection 4 is configured identically to the second top charge collection 5, and the first bottom charge collection 6 is configured identically to the second bottom charge collection 7. In other embodiments, this need not be the case.

In the embodiment shown, a charge collection comprises an electrically conducting material, such as a metal, such as copper or silver. In other embodiments, a charge collection can comprise any conducting material, such as graphene. In yet other embodiments, a charge collection can comprise an insulating material, with individual charges embedded within said material. In other words, the conductivity of the insulating material with respect to the embedded charges of a charge collection can be negligible in some embodiments. For example, a charge collection can comprise positively or negatively charged ions embedded within an electrical insulator, such as glass.

During nominal operations, the amount of charge in a charge collections can remain substantially constant. In the embodiment shown in FIG. 1, the amount of charge in a charge collection, such as charge collection 4, can also be regulated or controlled. This is useful for regulating the magnitude of the voltage conversion generated by the embodiment. The amount of charge in a charge collection, i.e. the charge density, can be regulated by connecting a charge collection to a separate voltage source by means of an electrical conductor, such as a copper wire. By changing the voltage of the separate voltage source, the amount of charge in a charge collection can be controlled. For example, the negative terminal of a voltage source can be electrically connected to first top charge collection 4, and the positive terminal of a voltage source can be electrically connected first bottom charge collection 6. A wide variety of methods are available for regulating the voltage of such a separate voltage source. Note that a top and bottom charge collection can be considered to be the charged plates of a capacitor, which is energized by the separate voltage source. In other embodiments, the voltage source need not be separate. In such embodiments, at least a portion of the voltage difference between a top charge collection and a corresponding bottom charge collection can be generated by the embodiment itself, i.e. by the voltage difference between station 33 and station 26. The top and bottom charge collections can thus be considered to be the opposing charge collections of a capacitor which is connected in parallel to an electrical circuit which connects first outside contact 34 with second outside contact 35.

An electrical conductor 20 connects a first outside contact 34 with a first conductor 8. Electrical conductor 20 can be a conductor such as graphene, or a metal such as copper. In some embodiments, electrical conductor 20 can also be considered to be a superconductor. In FIG. 1, electrical conductor 20 is shown as a bold line for simplicity, and can be considered to be an electrical wire. In some embodiments, electrical conductor 20 and first conductor 8 need not be distinguishable. In other words, electrical conductor 20 and first conductor 8 can be made of the same material, such as copper, and can have a substantially identical lengthwise cross-sectional area and geometry.

First conductor 8 can comprise a conducting material such as graphene, or a metal such as copper or silver. First conductor 8 can also be an intrinsic semiconductor. First conductor 8 can also be an extrinsic semiconductor, i.e. an n-type or p-type semiconductor. First conductor 8 can also be doped with both n-type and p-type dopants, both of which increase the conductivity of a semiconductor.

First conductor 8 has a rectangular cross-section when viewed along the Y-direction. In other embodiments, a first conductor 8 can have any cross-sectional geometry, such as a circular, square or polygonal cross-sectional geometry when viewed along the Y-direction.

An electrical conductor 22 is configured to connect station 29 of first conductor 8 to station 30 of second conductor 14 via electrical contacts, such as contact 23. As mentioned in the context of electrical conductor 20, electrical conductor 22 can be made of the same material and can have the same lengthwise cross-sectional area as first conductor 8. Electrical conductor 21 is configured in a similar manner as electrical conductor 20 in the embodiment shown in FIG. 1.

Note that the terms "top" and "bottom" only refer to the location relative to a potential well produced by these collections of charge, and are not intended to indicate the position relative to a spatial coordinate frame, such as the XYZ-frame shown. The potential energy of a majority mobile charge carrier in first conductor 8 or second conductor 14 is defined to be lower at the bottom than it is at the top. For instance, when the polarity of the collections of charge is reversed, ceteris paribus, the terms are reversed, i.e. "top" can be replaced by "bottom", and vice versa. By default, the charge carriers are assumed to be negatively charged. In some embodiments, however, at least a portion of charge carriers can be positively charged.

Second conductor 14 can comprise a conducting material, where the average conductivity of the conductor along the path of current flow through the length of the conductor is smaller than the same average conductivity associated with first conductor 8. Second conductor 14 can be made of similar types of materials as first conductor 8, and vice versa. For example, second conductor 14 can be a semiconductor, such as silicon, and first conductor 8 can be a metal such as copper. First conductor 8 can also be a doped semiconductor, where the doping has increased the conductivity of first conductor 8 to a value greater than the conductivity of second conductor 14. In order to simplify manufacturing, it can be desirable for first conductor 8 and second conductor 14 to be made of the same original material, such as silicon or gallium arsenide. In this case, the amount of doping can be configured to be larger in the first conductor 8 such that the conductivity of the first conductor 8 is greater than the conductivity in the second conductor 14. Alternatively, the type of dopant material, i.e. the molecular species of the impurity, can be configured to achieve the same effect with respect to the relative conductivity of the first conductor 8 and the second conductor 14. As long as this condition is met, second conductor 14 and first conductor 8 can be made of any material, such as a doped semiconductor material, an intrinsic semiconductor material, or a conducting material such as metal. Other methods are available for configuring or selecting the material of first conductor 8 relative to the material of the second conductor 14 such that the conductivity of the first conductor 8 is greater than the conductivity in the second conductor 14. As is known in the art, the conductivity of a material is determined by a number of factors, such as the concentration of mobile charge carriers per unit volume, or the mean free path of a mobile charge carrier within a conductor, or the temperature of the conductor, amongst other parameters. Note that the first conductor 8 and the second conductor 14 can be made of the same material in some embodiments, provided the principles of the invention are applied. The mobile charges can be electrons or ions, for example. In the latter case, first conductor 8 or second conductor 14 can also be a liquid or a gas, through which the ions are able to diffuse.

Second conductor 14 has a rectangular cross-section when viewed along the Y-direction. In other embodiments, a second conductor 14 can have any cross-sectional geometry, such as a circular, square or polygonal cross-sectional geometry when viewed along the Y-direction.

The first assembly 2 comprises the first top charge collection 4, the first conductor 8, and the first bottom charge collection 6. The second assembly 3 comprises the second top charge collection 5, the second conductor 14, and the second bottom charge collection 7.

The electrical conductor 20, the first conductor 8, the electrical conductor 22, the second conductor 14, the electrical conductor 21 form a portion of an electric circuit, denoted the "conversion portion". In the embodiment shown in FIG. 1, this circuit is shown a closed circuit for simplicity. In some embodiments an open circuit can be formed between station 33 and station 26. In some embodiments, a separate electrical circuit, denoted the "load portion" 36 can be connected in parallel to the conversion portion. The two terminals of the load portion can be connected to the two terminals of the conversion portion, i.e. to first outside contact 34 and second outside contact 35. For some embodiments, an electrical current can be made to flow through the conversion portion. For example, current can flow from the second outside contact 35, through electrical conductor 21, second conductor 14, electrical conductor 22, first conductor 8, and electrical conductor 20 to the first outside contact 34 during nominal operations, where nominal operation involves a steady current flow. To close the current loop, current also flows from first outside contact 34 through the load portion 36 to the second outside contact 35 in this particular example. In some embodiments, at least a portion of the current flow is a result of a larger voltage at first outside contact 34 compared to second outside contact 35, where the larger voltage is a consequence of the configuration of the embodiment shown in FIG. 1.

The load portion can comprise any electrical device. For example, the load portion can comprise a conductor with a non-negligible resistivity. In some embodiments, the load portion can also be considered to comprise a single, conventional resistor. The load portion can also comprise electrical devices such as transistors, capacitors, or inductors. The load portion can also comprise an antenna configured to generate electromagnetic waves. The load portion can also comprise digital electronics, such as a microprocessor or computer. The load portion can also comprise an electric motor 39 configured to do mechanical work "WOUT". Note that electrical motors typically comprise heat exchangers, such as heat exchanger 40, in order to facilitate the flow of heat "QIN" between the electrical conductors and the outside environment. In the case in which the mobile charge carriers perform work WOUT, the heat QIN can flow from the outside environment to the mobile charge carriers. In this manner, the conductors remain at a suitable temperature during nominal operations, where suitability is determined by the objective and the constraints of the particular application and the configuration of the embodiment. In the simplified embodiment shown in FIG. 1, the heat exchanger 40 comprises several fins, such as fin 43. A fin can comprise a thin circular metal plate, for example, where mobile charge carriers can flow through the metal plate, and where the surface normal of the planar plate is parallel to the X-axis. The outside environment can comprise the air of the atmosphere, for instance. In some embodiments, heat can be exchanged between the heat exchanger and the outside environment via natural convection, forced convection, thermal radiation, or thermal conduction, for instance. The electrical current flowing through the conversion apparatus and the electrical load 36 can be configured to also flow through the heat exchanger 40, in order to facilitate the transfer of heat between the heat exchanger and the mobile charge carriers. The load portion can comprise any electrical device capable of sustaining a voltage drop while a non-negligible current flows through the load portion. The load portion can comprise a light emitting diode.

In the following paragraphs, the origin of a voltage difference between the first outside contact 34 and the second outside contact 35 will be explained. For simplicity, the conversion portion is an open circuit throughout this explanation, i.e. there is no current flow through the conversion portion. Note that, in the case in which current flows from first outside contact 34 to second outside contact 35 through the load portion, there is typically a decrease in the magnitude of the voltage difference between the first outside contact 34 and the second outside contact 35 compared to the open circuit scenario shown in FIG. 1. This decrease is due to a voltage drop within the conversion portion, which arises from the internal resistance of the conductors within the conversion portion and the current flowing through the conversion portion.

Consider the first assembly 2. When considered in isolation, the first top collection of charge 4 and the first bottom collection of charge 6 produce an electric field. In this "isolated case" the first top collection of charge 4 and the first bottom collection of charge 6 are surrounded by a vacuum. Consider a simplified scenario in which the field lines are assumed to be parallel to the Y-axis at all times. In this scenario, the electric field lines are directed in the positive Y-direction in the region between the first top collection of charge 4 and the first bottom collection of charge 6. The field is zero elsewhere in this simplified scenario. In reality, due to the finite size of the top and bottom charge collections, the field is non-uniform in magnitude and direction, in particular at the edges of the charge collections and the boundary of the "projected volume" between them, i.e. the volume enclosed by the projection of the boundary of a top charge collection onto the boundary of a bottom charge collection along the Y-direction. The aforementioned simplified scenario describes or reflects the general nature of the field, however. To summarize, in the isolated case in the simplified scenario, the magnitude of the electric field in the projected volume of the first top collection of charge 4 and the first bottom collection of charge 6 is uniform in space and time, and parallel to the Y-axis. The amount of charge in each charge collection is assumed to be constant in time and uniform in space throughout the charge collection.

In transitioning from the isolated case to the actual case shown in FIG. 1, consider the "reduced case" in which the isolated case is augmented by the placement of the first conductor 8 in between the first top collection of charge 4 and the first bottom collection of charge 6, as depicted in FIG. 1. In the reduced case, the electrical conductors 20 and 22 are not present. A portion of the mobile charges within first conductor 8 experience a body force per unit mass due to the electric field of the first top collection of charge 4 and the first bottom collection of charge 6. As a result, the density of negative mobile charges within first conductor 8 increases in the close proximity of the positively charged first bottom collection of charge 6. Note that, in a perfect conductor, this accumulation of negative charge is negligibly thin along the Y-direction. In this case the charges can be considered to accumulate at the surface of the first conductor 8 which faces the first bottom collection of charge 6. For illustrative purposes, in the embodiment shown in FIG. 1, first conductor 8 is not a perfect conductor, resulting in a small extent of the first bottom accumulation region 12 along the Y-direction, denoted the "thickness" of the accumulation region. First bottom boundary 13 schematically indicates the approximate extent of the first bottom accumulation region 12. Similarly, due to a conservation of charge, there is a positively charged first top depletion region 10, with a first top boundary 11. In other embodiments, the thickness of the first top depletion region 10 and the first bottom accumulation region 12 need not be identical. Due to the electric field produced by the first top depletion region 10 and the first bottom accumulation region 12 superimposed on the electric field produced by the first top collection of charge 4 and the first bottom collection of charge 6, the remaining portion of first conductor 8 is neutrally charged in this configuration. This portion is denoted the first neutral region 9.

Station 27 is located in first conductor 8 in negligibly close proximity to the top surface of first conductor 8, i.e. the surface facing the first top collection of charge 4, as indicated by the location of the label of station 27 in FIG. 1. Station 28 is located in the first neutral region 9 at the location shown. Station 29 is located in first conductor 8 in negligibly close proximity to the bottom surface of first conductor 8, i.e. the surface facing the first bottom collection of charge 6.

The configuration of the second assembly 3 in a reduced case can be described in a similar manner. The electric field produced by the second top collection of charge 5 and the second bottom collection of charge 7 results in a redistribution of mobile charge carriers within second conductor 14. This redistribution manifests itself in the form of a positively charged second top depletion region 16, with second top boundary 17 and a negatively charged second bottom accumulation region 18, with second bottom boundary 19. Due to the electric field produced by the second top depletion region 16 and second bottom accumulation region 18 superimposed on the electric field produced by the second top collection of charge 5 and the second bottom collection of charge 7, the remaining portion of second conductor 14 is neutrally charged in this configuration. This portion is denoted the second neutral region 15.

Station 30 is located in second conductor 14 in negligibly close proximity to the bottom surface of second conductor 14, i.e. the surface facing the second bottom collection of charge 7, as indicated by the location of the label of station 30 in FIG. 1. Station 31 is located in the second neutral region 15 at the location shown. Station 32 is located in second conductor 14 in negligibly close proximity to the top surface of second conductor 14, i.e. the surface facing the second top collection of charge 5.

In accordance with some embodiments of the invention, the thickness of the second top depletion region 16 is larger than the thickness of the first top depletion region 10. In accordance with some embodiments of the invention, the thickness of the second bottom accumulation region 18 is larger than the thickness of the first bottom accumulation region 12. In accordance with some embodiments of the invention, the sum of the thicknesses of the second bottom accumulation region 18 and the second top depletion region 16 is larger than the sum of the thicknesses of the first bottom accumulation region 12 and the first top depletion region 10.

In some embodiments, this is accomplished at least in part by a larger electrical conductivity associated with the first conductor 8 compared to the second conductor 14 and an externally applied electric field. In the embodiment shown in FIG. 1, this external field is generated by first top collection of charge 4, second top collection of charge 5, first bottom collection of charge 6, and second bottom collection of charge 7.

In some embodiments the thickness of the first top depletion region 10 is substantially equal to the thickness of the second top depletion region 16, while the thickness of the first bottom accumulation region 12 is smaller than the thickness of the second bottom accumulation region 18. In some embodiments the thickness of the first top depletion region 10 is smaller than the thickness of the second top depletion region 16, while the thickness of the first bottom accumulation region 12 is substantially equal to the thickness of the second bottom accumulation region 18.

To transition from the reduced case to the actual case depicted in FIG. 1, the electrical conductor 22 needs to be considered. The electrical connection between stations 29 and 30 by electrical conductor 22 can have an effect on the thickness and form of the first bottom accumulation region 12 and the second bottom accumulation region 18. For example, a larger density of mobile charge carriers, such as electrons, at station 29 in the reduced case compared to station 30 can result in the diffusion of charges from station 29 to station 30 in a conceptual transition from the reduced case to the actual case, e.g. by closing a hypothetical switch between stations 29 and station 30. This increases the thickness of second bottom accumulation region 18 compared to the reduced case, and reduces the thickness of the first bottom accumulation region 12 compared to the reduced case. This can increase the potential energy of a negatively charged mobile charge in the second neutral region 15 compared to the reduced case. Similarly, this can reduce the potential energy of a negatively charged mobile charge in the first neutral region 9 compared to the reduced case. As a result, a net voltage difference between the first neutral region 9 and the second neutral region 15 can arise. The increased thickness of the second accumulation region 18 and the reduced thickness of the first bottom accumulation region 12 results in an electric field being produced at the interface between the first conductor 8 and the second conductor 14, between station 29 and station 30. As a result of this field, there is a drift current of mobile charges from station 30 to station 29, which cancels the diffusion current of mobile charges from station 29 to station 30 due to the aforementioned charge density difference between station 29 and station 30. Once this new equilibrium is reached, the conceptual transition from the theoretical, reduced case to the actual, depicted, open-circuit case can be considered to be complete.

Note that the net voltage difference between the first neutral region 9 and the second neutral region 15 in the open circuit, actual case can be zero or negative, because this voltage difference takes into account the contact potential between the first conductor 8 and the second conductor 14 in the open circuit scenario being considered. However, as soon as the circuit is closed, any voltage difference associated with the electrical contact between first conductor 8 and second conductor 14 established by electrical conductor 22 is offset by the electrical contact between the same second conductor 14 and the same first conductor 8 established by electrical conductors 21 and 20 and the load portion of the closed circuit. In other words, the contact potentials cancel in a closed circuit.

Note that, in some embodiments, the net diffusion of charges from station 29 to station 30 throughout a conceptual transition from the reduced case to the actual case can also be zero or negative. For example, the contact potential between first conductor 8 and the second conductor 14 can produce an electric field on the diffusion current path between station 30 and station 29, which prevents the net motion of charges between station 29 and station 30 in a conceptual transition from the reduced case to the actual, open circuit case shown in FIG. 1. In such configurations, the distribution of charge in the first conductor 8 and second conductor 14 in the reduced case can be substantially equal to the distribution of charge in the actual case.

Note that the current path through the embodiment in FIG. 1 is U-shaped and the potential well is \-shaped. In other words, the depth of the potential well increases in the negative Y-direction since the potential energy of a mobile charge carrier in the electric field in the isolated case decreases in the negative Y-direction. In other embodiments, the current path can be unidirectional, i.e. I-shaped, and the potential well can be >-shaped. Note that, in both of these types of embodiments, the potential well along the current path is >-shaped. The latter embodiment can be explained as follows. The central axis of the second conductor can coincide with the central axis of the first conductor, with the two conductors being offset in the Y-direction. The connection between the first conductor and the second conductor can be formed by an electrical conductor which is parallel to the Y-axis, similarly to electrical conductor 22, which is parallel to the X-axis. Said electrical conductor can pass through an insulated portion of a bottom collection of charge. Alternatively, the first conductor and second conductor can be in direct physical contact, where the location of contact is surrounded by an insulated bottom collection of charge. In other words, the bottom collection of charge can be configured to surround the region of contact between the first and second conductor like a toroid surrounds a central cylinder. Note that the bottom collection of charge and the first and second conductor need to be configured in a manner in which the bottom accumulation region of each conductor, i.e. both the first conductor and the second conductor, spans the entire cross-sectional area of each conductor when viewed along the Y-direction. In other words, the minimum sum of the thicknesses of both bottom accumulation regions should be non-zero, where the minimum is calculated over the cross-section of the first or second conductors viewed in the Y-direction. In such embodiments, the first top collection of charge is located at the top of the I-shaped arrangement of the first and second conductors, and the second top collection of charge is located at the bottom of the I-shaped arrangement, with the bottom collection of charge being located half-way along the I-shaped arrangement when the length of the first and second conductors along the Y-direction is identical.

In some embodiments, the bulk material 1 is electrostatically insulated from the surroundings. This insulation can comprise a conducting material, such as a metal. In this case, the embodiment can be configured in a manner in which the net charge enclosed within bulk material 1 is zero during nominal operations. This could mitigate any electrostatic interference of the field generated by a top or bottom collection of charge within bulk material 1 by any external electric fields.

In some embodiments, first top charge collection 4 and second top charge collection 5 are joined together to form a single, top collection of charge. Similarly, a single bottom collection of charge can be configured in the same manner.

In some embodiments, the may only be a single type of collection of charge. For example, some embodiments comprise only one or more bottom collections of charge, without there being a single top collection of charge. In some embodiments, the top and bottom collections of charge need not contain the same amount of charge.

FIG. 2 shows a plot of the approximate value of several physical parameters as a function of position.

For simplicity, the contact potential between the second conductor 14 and the first conductor 8 is assumed to produce an electric field between the contact potential between the second conductor 14 and the first conductor 8, such that there is no diffusion of mobile charge carriers from the first conductor 8 to the second conductor 14, or vice versa, when the transition from the reduced case to the actual case depicted in FIG. 1 is made. In other words, the thickness of the second bottom accumulation region 18 and the first bottom accumulation region 12 is substantially identical for the aforementioned theoretical, reduced case and the depicted actual, open circuit case.

Axis 50, which is parallel to the X-axis, denotes the magnitude of a value of a physical parameter corresponding to a specified line. Axis 51, which is parallel to the Y-axis, denotes the location of the value of the physical parameter of a specified line at a position along the Y-axis, where the position is measured relative to the origin of axis 50 and axis 51.

Line 52 denotes the value of the average charge density in first top collection of charge 4, or second top collection of charge 5 at a given location along the Y-axis. In this simplified model, the amount of charge per unit volume in a first top collection of charge is assumed to be constant throughout a collection of charge. In some embodiments, or in practice, this need not be the case. For example, the charge density can decrease throughout a top collection of charge in the positive Y-direction.

Line 53 denotes the average charge density in first bottom collection of charge 6, or second bottom collection of charge 7 at a given location along the Y-axis. As before, the charge density throughout a bottom collection of charge is assumed to be constant. In some embodiments, or in practice, the charge density can increase throughout a bottom collection of charge in the positive Y-direction.

Line 54 denotes the average charge density in the first depletion region 10 in first conductor 8 at a given location along the Y-axis. Line 55 denotes the average charge density in the first accumulation region 12 in first conductor 8 at a given location along the Y-axis. Line 56 denotes the average charge density in the second depletion region 16 in second conductor 14 at a given location along the Y-axis. Line 57 denotes the average charge density in the second accumulation region 18 in second conductor 14 at a given location along the Y-axis. As before, the average charge density in a depletion or accumulation region need not be uniform in practice, or in other embodiments. For example, the average charge density can decrease more gradually in a direction towards the neutral region of the corresponding conductor, or in a direction towards the other accumulation region or other depletion region of the corresponding conductor. For instance, in some embodiments, the magnitude of the average charge density can be substantially constant in the second top depletion region 16, as shown by line 56, but increase in at an increasing rate in the negative Y-direction in the second bottom accumulation region 18. In some embodiments the increase occurs in exponential fashion. For other embodiments the magnitude of the average charge density can increase in at an increasing rate in the positive Y-direction in a top accumulation region. In some embodiments the magnitude of the average charge density increases in at an increasing rate in both the accumulation region and the depletion region of a specified conductor, such as the second conductor 14, where the increase is measured relative to the neutral region or the interface between the accumulation region and the depletion region.

During nominal operations, some embodiments of the invention are configured in a manner in which there are a sufficient number of mobile charge carriers at stations 32 and 27, or stations 30 and 29, or stations 33 and 26 for current to flow through the conversion portion as soon as a closed circuit is formed by attaching a load portion between first outside contact 34 and second outside contact 35.

In some embodiments, electrical conductor 20 is not attached to first conductor 8 at station 27, but rather at station 28. In other words, electrical conductor 20 is electrically connected to first neutral region 9. In some embodiments, electrical conductor 21 is attached to second conductor 14 at station 31 as opposed to station 32. In other words, electrical conductor 21 is electrically connected to second neutral region 15. When the majority of mobile electrical charges are negatively charged, such as in the case in which the mobile charges are electrons, such a configuration can reduce the internal resistance of the conversion apparatus, where the internal resistance is the resistance associated with a current flowing through the depicted conversion portion. Note that, in some embodiments, this reduction in internal resistance also applies to the case in which the majority of mobile charges are positively charged. In other embodiments, the electrical conductors 20, 21, and 22 can be connected to the first or second conductors at any suitable locations along the Y-direction, i.e. along the depth of the potential well.

In some embodiments, the electrical contact 23 in the first conductor 8 need not lie in the region of accumulation of charge 12, but can lie in the neutrally charged region 9 of the first conductor 8. In such embodiments, the first conductor 8 can be a metal, for example. In such embodiments the electrical coupling 22 can connect a nominally neutrally charged region in the first conductor 8, such as the region at station 28, with a nominally charged region in the second conductor 14, such as the region of accumulation of charge 18. In such embodiments the second conductor can be a semiconductor, for example. In such embodiments the internal resistance of the conversion apparatus can be reduced further, since the resistance of metals such as copper is typically small compared to the resistance of semiconductors.

Note that the total amount of charge per unit cross-sectional area viewed along the Y-axis contained within the entire first accumulation region 12 and the entire second accumulation region 18 is substantially identical. The same is true for the first depletion region 10 and the second depletion region 16. This is a consequence of Gauss' law and the assumptions employed in the aforementioned simplified scenario.

The collections of charge and the accumulation and depletion regions produce an electric field. The value of the electric field associated with first assembly 2 is represented by line 58 and line 59. These lines indicate the component of the electric field directed in the negative Y-direction, where the electric field is measured along the longitudinal centerline of first conductor 8, which is parallel to the Y-axis. Similarly, the value of the electric field associated with second assembly 3 is represented by line 60 and line 61.

The potential energy of a negatively charged mobile charge diffusing from station 26 to station 33 via stations 27, 28, 29, 30, 31, and 32 is indicated by line 62. The potential energy at station 33 is larger than at station 26. Thus, when the open circuit is closed with a load portion, the mobile negative charges will move through the load portion from station 33 to station 26, and through the depicted conversion portion from station 26 to station 33 to complete the circuit.

The voltage at station 27 is larger than the voltage at station 32. Due to symmetry, this voltage difference is maintained between first outside contact 34 and second outside contact 35, which are located far enough from the collections of charge, such as first top charge collection 4, such that the ambient electric field is negligible. Note that, in some embodiments, the thickness of a neutral region, such as second neutral region 15, is zero. Thus, a low voltage at station 33 can be considered to have been converted by the embodiment of the invention into a higher voltage at station 34.

In some embodiments, several conversion portions, such as the conversion portion shown in FIG. 1, are electrically connected in series. In other words, the second outside electrical contact 35 of a first conversion portion is connected to the first electrical outside contact 34 of a second conversion portion.

In some embodiments, as illustrated in FIG. 3, several conversion portions, such as the conversion portion shown in FIG. 1, are electrically connected in parallel. In other words, the second outside electrical contact 35 of a first conversion portion is connected to the second outside electrical contact 35 of a second conversion portion, and the first electrical outside contact 34 of a first conversion portion is connected to the first electrical outside contact 34 of a second conversion portion. In general, the load portion of a given conversion portion can comprise at least one other conversion portion of the same or similar type as the given conversion portion.

In some embodiments, the extent of a conductor, such as first conductor 8, in the Y-direction, denoted the conductor "height", is on the order of one nanometer. In some embodiments, this length is on the order of one micrometer. In some embodiments this length is within several orders of magnitude of one micrometer. In some embodiments, this length is on the order of a centimeter. In some embodiments, this length is on the order of a meter. This length can be take any suitable value in other embodiments.

The extent of a conductor, such as first conductor 8, in the X-direction, denoted the conductor "width", is on the order of one nanometer in some embodiments. The width of first conductor 8 need not be equal to the width of second conductor 14. The width can take any suitable value. In some embodiments, the cross-sectional area of a conductor, such as first conductor 8, viewed along the Y-direction is on the order of a square centimeter. In some embodiments, this area is on the order of a square meter. The area can take any suitable value.

Embodiments of the invention can be manufactured using a wide variety of methods and processes. Such methods area known in the art of semiconductor manufacturing, for example.

The change in the potential energy of a mobile charge carrier diffusing or moving through a region of accumulation of charge, such as depletion region 10, or accumulation region 12, or depletion region 16, or accumulation region 18, is a function of a wide variety of "relevant properties", or "relevant parameters". In accordance with some embodiments of the invention, at least one relevant property of the first conductor 8 is different than the same relevant property in the second conductor 14. In this manner, the change in the potential energy of a mobile charge carrier moving or diffusing through a region of accumulation of charge is different in the first conductor and the second conductor for a given change in position in the potential well formed by the body force generating apparatus. In the embodiment in FIG. 1, the body force generating apparatus is embodied by the electric field generating apparatus, which comprises collections of charge 4, 5, 6, and 7. The body force generating apparatus is configured to generate an electrical body force per unit mass acting on mobile charge carriers in the first conductor 8 and second conductor 14.

In other embodiments, other types of body forces per unit mass can be configured to act on the mobile charge carriers within a conductor. For example, a body force generating apparatus can comprise a magnetic field generating apparatus, where at least a portion of the body force per unit mass acting on the mobile charge carriers in a first and/or second conductor can be magnetic in nature.

A body force generating apparatus can comprise a gravitational field generating apparatus, where at least a portion of the body force per unit mass acting on the mobile charge carriers in a first and/or second conductor can be gravitational in nature. In this embodiment, the body force generating apparatus can comprise a mass, such as the mass of planet earth, located below the first conductor 8 and second conductor 14, similar to collections of charge 6 or 7, as shown in FIG. 1. In embodiments in which the mobile charge carriers carry a net charge, as is the case of mobile electrons in a fixed lattice of positively charged nuclei, the regions of accumulation of charge on opposing ends of a reservoir, such as the reservoir formed by first conductor 8, generate an electrical field within the remaining portion of the reservoir, where the electric field cancels the body force per unit mass, such as the gravitational body force per unit mass, acting on the mobile charge carriers. The neutrally charged portion of the reservoir, such as neutrally charged portion 28, can comprise an electric field in such embodiments, which is in contrast to the neutrally charged portion 28 shown in FIG. 1, in which the body force generating apparatus comprises an electrical field generating apparatus. Note that, in general, it is sufficient for the mobility of one type of mobile charge carrier to be different to the mobility of another type of mobile charge carrier within a material. In general, both the positively charged charge carriers and the negatively charged charge carriers in a reservoir can be mobile charge carriers, provided the relevant properties of both charge carriers are different. This ensures that a body force generating apparatus can be configured to generate a region of accumulation of net charge within a reservoir in the scenario in which the body force per unit mass acting on both types of mobile charge carriers is identical.

A body force generating apparatus can comprise an acceleration generating apparatus, where at least a portion of the body force per unit mass acting on the mobile charge carriers in a first and/or second conductor can be inertial in nature. For example, the reservoir of mobile charge carriers, such as the reservoir formed by the first conductor 8 or second conductor 14, can be accelerated in an inertial reference frame. The mobile charge carriers contained within the reservoirs thus experience an effective or perceived acceleration relative to the boundaries or the walls of the reservoir. The acceleration in an inertial frame can be due to a translational accelerating motion, or a rotational motion of the reservoir, for example. In the latter case, the reservoirs can be rotated about an axis parallel to the X-axis, where the axis is located in the positive Y-direction of station 27, for instance. In such embodiments the first conductor 8 and/or the second conductor can comprise a plasma, for instance.

As mentioned, the set of relevant properties can comprise the electrical resistivity of a material. The electrical resistivity in the second conductor 14 can be larger than in the first conductor 8, resulting in a larger thickness of the regions of accumulation of charge in the second conductor 14 than in the first conductor 8, as shown, resulting in a larger potential energy of mobile charge carriers at station 31 than at station 28, or a larger potential energy at station 32 than at station 27. Note that the electrical resistivity is a function of a large number of material properties. For example, the cross-sectional area of the second conductor 14 can be smaller than the cross-sectional area of the first conductor 8, resulting in a larger resistivity of the second conductor compared to the first conductor. The cross-sectional area can be measured along the direction of current flow, for instance.

The set of relevant properties can also comprise the number of mobile charge carriers per unit volume in a material. For instance, in FIG. 1, the number of mobile charge carriers per unit volume in the first conductor 8 can be larger than in the second conductor 14. In particular the thickness of a region of accumulation of mobile charge carriers, such as the thickness of accumulation region 12 or accumulation region 18, is a function of the number of mobile charge carriers per unit volume. In a semiconductor, the set of relevant properties can comprise the number of donor or acceptor atoms per unit volume. Note that a hole in a semiconductor can also be considered to be a mobile charge carrier. In a metal, the set of relevant properties can comprise the number of free electrons or the number of conducting electrons per unit volume. In a solution, or in a gas, the set of relevant properties can comprise the number of ions per unit volume, for example.

The set of relevant properties can also comprise the number of fixed charge carriers per unit volume in a material. In a solid, a fixed charge carrier can be a positively charged nucleus of an atom, for example. For instance, in FIG. 1, the number of fixed charge carriers per unit volume in the first conductor 8 can be larger than in the second conductor 14. In particular the thickness of a region of depletion of mobile charge carriers, such as the thickness of depletion region 10 or depletion region 16, is a function of the number of fixed charge carriers per unit volume. In a metal or semiconductor, the set of relevant properties can also comprise the number of atoms per unit volume, for example. In a doped semiconductor, the set of relevant properties can comprise the number of donor or acceptor atoms per unit volume.

The set of relevant properties can also comprise the temperature of a material. For example, the temperature in the second conductor 14 can be larger than the temperature in the first conductor 8. As a result, the thickness of the region of an accumulation of charge in the first conductor 8 can be larger in the second conductor 14 than in the first conductor 8, ceteris paribus. The temperature is particularly relevant in determining the thickness of a region of accumulation of mobile charge carriers. In a subset of embodiments, the temperature difference between said conductors can be maintained by a first thermal reservoir which is thermally coupled to the first conductor 8, and a second thermal reservoir which is thermally coupled to the second conductor 14, for example. The temperature of the second thermal reservoir can be larger than the temperature of the first thermal reservoir. In such an embodiment, the voltage conversion apparatus can be operated in a similar manner as a conventional thermoelectric generator, such as a thermoelectric generator employing the Peltier effect.

The set of relevant properties can also comprise the absolute permittivity of a material. In the case in which the body force generating apparatus comprises an electrical field generating apparatus, and in the case in which the electric field generating apparatus comprises a fixed collection of charge, the absolute permittivity in the second conductor 14 can be smaller than in the first conductor 8. In this case the average potential energy of mobile charge carriers at station 31 can be larger than at station 28. Note that in some embodiments the thickness of the accumulation region 18 in the second conductor 14 can be smaller than the thickness of the accumulation region 12 in the first conductor 8, despite the potential energy of mobile charge carriers being larger at station 31 than at station 28.

In the case in which the body force generating apparatus comprises an electrical field generating apparatus, and in the case in which the electric field generating apparatus comprises a variable collection of charge, such as a collection of charge on an electrical conductor, where the electrical charge is supplied by an external electrical voltage source such as a battery, the absolute permittivity in the second conductor 14 can be larger than in the first conductor 8. In this case the average potential energy of mobile charge carriers at station 31 can be larger than at station 28. In such embodiments the thickness of the accumulation region 18 in the second conductor 14 can be larger than the thickness of the accumulation region 12 in the first conductor 8, as shown in FIG. 1.

The set of relevant properties can also comprise the average amount of charge carried by a mobile charge carrier in a material. For example, the average amount of charge carried by a mobile charge carrier in the second conductor 14 can be smaller than in the first conductor 8. This can result in a larger potential energy of mobile charge carriers at station 31 than at station 28 in an open circuit scenario.

The set of relevant properties can also comprise the strength of the electric field at the boundary of a material. The boundary for the second conductor 14, denoted the "second boundary", can be the boundary of the second conductor 14 and the insulating material 1 at the boundary facing a collection of charge, such as collection of charge 7 or collection of charge 5, i.e. at a boundary for which the surface normal is parallel to the Y-axis. The boundary for the first conductor 8, denoted the "first boundary", can be the boundary of the first conductor 8 and the insulating material 1 at the boundary facing a collection of charge, such as collection of charge 6 or collection of charge 4, i.e. at a boundary for which the surface normal is parallel to the Y-axis. For example, the strength of the electric field within the second conductor 14 at the second boundary can be larger than the strength of the electric field within the first conductor 8. As a result, the thickness of the associated region of accumulation of charge can be larger in the second conductor 14 than the thickness of the associated and corresponding region of accumulation of charge in the first conductor 8, and the average potential energy of the mobile charge carriers at station 31 can be larger than at station 28.

The aforementioned relevant properties are particularly relevant in the case in which the regions of accumulation of charge are substantially isothermal. In some embodiments, the change in the density of mobile charge carriers throughout a region of accumulation of charge can be described as an adiabatic or polytropic process. In some embodiments, the change in density can be described as an isobaric process, for instance. A non-isothermal region of accumulation of charge can be found in a first or second conductor in the case in which the thermal conductivity of the first or second conductor is comparatively low, for instance. A nonthermal plasma or a semiconductor can exemplify such behavior. Note that, in the case in which there is a net current flow, a region of accumulation of charge is less likely to be isothermal due to the change in the potential energy of mobile charge carriers and the associated change in temperature of mobile charge carriers, as well as other thermal effects such as Joule heating.

The set of relevant properties can also comprise the effective mass of a mobile charge carrier within a material. For example, the effective mass of a mobile charge carrier in the second conductor 14 can be smaller than the effective mass of a mobile charge carrier in the first conductor 8 in a subset of embodiments. In some embodiments, the change in the density of mobile charge carriers throughout a region of accumulation of charge can be described as an adiabatic process, for example.

In some embodiments, an electrical switch can also be located between station 33 and station 26, where the switch can be employed to regulate the current flow though the electrical load 36, for example. A variable resistance can also be located between station 33 and station 26, where the resistance can be employed to regulate the rate of current flow though the electrical load 36, or the voltage across the electrical load, for example. In some embodiments a voltage regulator can be employed to regulate the voltage across the electrical load 36.

The mobile charge carriers can comprise electrons, holes, or positively or negatively charged ions.

Electrical conductor 22 can be described as an electrical coupling. Electrical load 36 and heat exchanger 40 can also be considered to be constituent parts of an electrical coupling.

In other embodiments, the insulated collections of charge, such as collections of charge 4, 5, 6, or 7, can be embedded within the first conductor 8 and within the second conductor 14. A collection of charge can comprise multiple insulated individual collections of charge, for instance. This can allow mobile charge carriers to diffuse through the first or second material of the first and second conductor, respectively, and through the insulated collections of charge embedded therein.

In some embodiments, the collections of charge can be located adjacent to the first or second conductors, as opposed to above and below the first and second conductors. In other words, the collection of charge 4 can be located in the positive and negative X-direction of the first conductor 8 as opposed to in the positive Y-direction of first conductor 8. For instance, the collection of charge 4 can be annular in shape, and can be configured to envelop a first conductor 8 which is circular in cross-section. In a subset of such embodiments, the long axis of a first conductor and a second conductor which are circular in cross-section can be coincident and parallel. Several such first and second conductors can be connected in series. The junction between a first conductor and a second conductor can be enveloped by an annular collection of charge, where the charge carried by a collection of charge for adjacent junctions can be of an opposing sign, and where the first and second conductors pass through the center of an annular collection of charge. The first and second conductor can be cylindrical in shape, and can be of a similar radius in a subset of embodiments. In other embodiments, the radius of the second conductor can be smaller than in the first conductor, ceteris paribus. The insulated collection of charge at a junction can be configured to be symmetric across the plane of a junction in some embodiments. As before, the collections of charge can be electrically insulated from the first and second conductors by an electrical insulator such as glass, plastic, or PVC. At junction, a first conductor can be in direct contact with a second conductor, allowing mobile charge carriers to move between the first and second conductors. As before, the thickness of a region of accumulation of charge at a junction between a first conductor and a second conductor can be larger in a second conductor than in the first conductor. As before, the mobile charge carriers can experience a greater change in their potential energy throughout a second conductor compared to a first conductor. As before, this can be due to the relevant properties in the second conductor being different compared to the first conductor. As before, the external, insulated collections of charge can comprise fixed electrical charges embedded within a material, or can comprise electrical conductors which are charged by an external electrical energy supply, such as a battery, a capacitor, an inductor, or a thermoelectric generator. Note that the insulated collections of charge can be electrically charged, at least in part, by the same potential energy conversion apparatus of which it is part, or the same voltage conversion apparatus in which the collection of charge is employed as a body force generating apparatus.

In a semiconductor, the rate of change of the density of mobile charge carriers can be described by the following continuity equations:

$$J_n = e\mu_n nE + e\, D_n \frac{dn}{dx}$$

$$J_p = e\mu_p pE - e\, D_p \frac{dp}{dx}$$

In these equations $J_n$ is the current density of electrons, e is the charge per electron, $\mu_n$ is the electron mobility, n is density of mobile charge carriers per unit volume, i.e. the density of mobile electrons per unit volume, E is the local electric field strength, which is a function of position, $D_n$ is the mobile electron diffusion constant, and x is the position in space.

Similarly $J_p$ is the current density of holes, e is the charge per hole, $\mu_p$ is the hole mobility, p is density of mobile charge carriers per unit volume, i.e. the density of mobile holes per unit volume, E is the local electric field strength, which is a function of position, $D_p$ is the mobile hole diffusion constant, and x is the position in space.

In the case in which the behavior of mobile charge carriers within a region of accumulation of charge can be described as an isothermal behavior, the following Einstein relations apply:

$$D_n = \frac{kT}{e}\mu_n \qquad D_p = \frac{kT}{e}\mu_p$$

In these equations T is the temperature of the material. Note that the local electric field is a function of the adjacent accumulation of charge, such as the accumulation of mobile charge carriers. The influence of neighboring accumulations of charge can be expressed in terms of Gauss' law. This results in the following Poisson's equation:

$$\varepsilon_r\varepsilon_0 \frac{\partial E}{\partial x} = e(p - n + N_D - N_A)$$

In this Poisson's equation, the product $\varepsilon_r\varepsilon_0$ is the absolute permittivity, where $\varepsilon_r$ is the relative permittivity, and $\varepsilon_0$ is the permittivity of the vacuum. $N_D$ is the number of donor atoms per unit volume for n-type doping, and $N_A$ is the number of acceptor atoms per unit volume for p-type doping.

By taking a spatial derivative of the above continuity equations for the case in which the current density of electrons and holes is zero, i.e. in the open circuit case, and by using Poisson's equation to solve for the electric field, the density of mobile charge carriers as a function of position within a region of accumulation of mobile charge carriers can be calculated. Note that the density of mobile charge carriers can saturate in an accumulation or depletion region. The variation of the density of mobile charge carriers for other materials, such as metals or plasmas, can be calculated in similar fashion.

ASPECTS OF THE INVENTION

The invention is further defined by the following aspects.

Aspect 1. A potential energy modification apparatus, wherein the potential energy modification apparatus comprises: a body force generating apparatus; a first material, wherein the first material is electrically conducting, wherein the body force generating apparatus can be configured to induce a region of accumulation of charge within the first material, and wherein the first material comprises a first point and a second point Aspect 2. The apparatus of aspect 1, wherein the apparatus further comprises a second material, wherein the second material is electrically conducting, wherein the body force generating apparatus can be configured to induce a region of accumulation of charge within the second material, and wherein the second material comprises a first point and a second point Aspect 3. The apparatus of aspect 2, wherein the second point in the second material is electrically coupled to the second point in the first material Aspect 4. The apparatus of aspect 1, wherein a mobile charge carrier at the first point in the first material can have a different potential energy than a mobile charge carrier at the second point in the first material on average in an open circuit scenario Aspect 5. The apparatus of aspect 2, wherein a mobile charge carrier at the first point in the second material can have a different potential energy than a mobile charge carrier at the second point in the second material on average in an open circuit scenario Aspect 6. The apparatus of aspect 2, wherein a mobile charge carrier at the first point in the second material can have substantially the same potential energy as a mobile charge carrier at the second point in the second material on average in an open circuit scenario Aspect 7. The apparatus of aspect 1, wherein the second point in the first material lies within a region of accumulation of charge Aspect 8. The apparatus of aspect 2, wherein the second point in the second material lies within a region of accumulation of charge Aspect 9. The apparatus of aspect 2, wherein the second point in the second material lies within a neutrally charged region Aspect 10. The apparatus of aspect 2, wherein the first point in the second material is electrically coupled to the first point in the first material Aspect 11. The apparatus of aspect 3, wherein the first point in the second material is electrically coupled to the first point in the first material Aspect 12. The apparatus of any one of aspects 3, 10, or 11, wherein the electrical coupling comprises an electrical conductor Aspect 13. The apparatus of any one of aspects 3, 10, or 11, wherein the electrical coupling comprises a capacitor Aspect 14. The apparatus of any one of aspects 3, 10, or 11, wherein the electrical coupling comprises an inductor Aspect 15. The apparatus of any one of aspects 3, 10, or 11, wherein the electrical coupling comprises an alternating current Aspect 16. The apparatus of any one of aspects 3, 10, or 11, wherein the electrical coupling comprises a direct current Aspect 17. The apparatus of any one of aspects 3, 10, or 11, wherein the electrical coupling comprises the transfer of electrical power between the two points in space or time Aspect 18. The apparatus of aspect 4, wherein at least a portion of the change in the potential energy is due to the region of accumulation of charge within the first material Aspect 19. The apparatus of aspect 5, wherein at least a portion of the change in the potential energy is due to the region of accumulation of charge within the second material Aspect 20. The apparatus of aspect 1, wherein the first point in the first material lies within a region of accumulation of charge Aspect 21. The apparatus of aspect 1, wherein the first point in the first material lies within a neutrally charged region Aspect 22. The apparatus of aspect 2, wherein the first point in the second material lies within a region of accumulation of charge Aspect 23. The apparatus of aspect 2, wherein the first point in the second material lies within a neutrally charged region Aspect 24. The apparatus of any one of aspects 2 or 3, wherein the thickness of the region of accumulation of charge within the second material is smaller than the thickness of the region of accumulation of charge within the first material Aspect 25. The apparatus of any one of aspects 2 or 3, wherein the change in the potential energy of a mobile charge carrier moving through the region of accumulation of charge within the first material is larger in magnitude than the change in the potential energy of a mobile charge carrier moving through the region of accumulation of charge within the second material.

Aspect 26. The apparatus of any one of aspects 2 or 3, wherein the relevant properties of the second material are different than the relevant properties in the first material Aspect 27. The apparatus of any one of aspects 2 or 3, wherein the relevant material properties of the second material are different than the relevant material properties in the first material Aspect 28. The apparatus of any one of aspects 2 or 3, wherein the change in the potential energy of a mobile charge carrier moving through at least a portion of the region of accumulation of charge between the first point in the first material and the second point in the first material is larger in magnitude than the change in the potential energy of a mobile charge carrier moving through at least a portion of the region of accumulation of charge between the first point in the second material and the second point in the second material Aspect 29. The apparatus of any one of aspects 2 or 3, wherein at least a portion of the first material is electrically insulated from a second material Aspect 30. The apparatus of aspect 3, wherein the body force generating apparatus comprises an electric field generating apparatus, wherein at least a portion of the body force is electric in nature Aspect 31. The apparatus of aspect 30, wherein the electric field generating apparatus comprises a collection of charge Aspect 32. The apparatus of aspect 30, wherein the electric field generating apparatus comprises an electrical conductor can be configured to be able to be positively or negatively charged Aspect 33. The apparatus of aspect 32, wherein the electrical conductor and an electrical power source, wherein the electrical power source can be configured to positively or negatively charge the electrical conductor Aspect 34. The apparatus of aspect 33, wherein the electrical power source can comprise a battery Aspect 35. The apparatus of aspect 33, wherein the electrical power source can comprise a capacitor Aspect 36. The apparatus of aspect 33, wherein the electrical power source can comprise an inductor Aspect 37. The apparatus of aspect 33, wherein the electrical power source can comprise an electricity generator Aspect 38. The apparatus of aspect 37, wherein the electricity generator can comprise an electric motor Aspect 39. The apparatus of aspect 37, wherein the electricity generator can comprise a thermoelectric generator Aspect 40. The apparatus of aspect 37, wherein at least a portion of the electricity is generated by any one of the potential energy modification apparatuses of any one of all other aspects of the invention.

Aspect 41. The apparatus of aspect 3, wherein the body force generating apparatus comprises a gravitational field generating apparatus, and wherein at least a portion of the body force is gravitational in nature Aspect 42. The apparatus of aspect 3, wherein the body force generating apparatus comprises a magnetic field generating apparatus, and wherein at least a portion of the body force is magnetic in nature Aspect 43. The apparatus of aspect 1, wherein the body force generating apparatus comprises an electromagnetic field generating apparatus, and wherein at least a portion of the body force is electromagnetic in nature Aspect 44. The apparatus of aspect 3, wherein the body force generating apparatus comprises an electromagnetic field generating apparatus, and wherein at least a portion of the body force is electromagnetic in nature Aspect 45. The apparatus of aspect 3, wherein the body force generating apparatus comprises an accelerating apparatus, wherein the accelerating apparatus is configured to accelerate the first material or the second material in an inertial frame, and wherein at least a portion of the body force is inertial in nature Aspect 46. The apparatus of aspect 45 wherein the acceleration is centripetal in nature Aspect 47. The apparatus of aspect 45 wherein the acceleration is translational in nature Aspect 48. The apparatus of aspect 1 wherein the first material comprises mobile charge carriers Aspect 49. The apparatus of aspect 2 wherein the second material comprises mobile charge carriers Aspect 50. The apparatus of any one of aspects 1, 2, 48, or 49, wherein the mobile charge carriers comprise electrons Aspect 51. The apparatus of any one of aspects 1, 2, 48, or 49, wherein the mobile charge carriers comprise positively or negatively charged ions Aspect 52. The apparatus of any one of aspects 1, 2, 48, or 49, wherein the mobile charge carriers comprise holes Aspect 53. The apparatus of aspect 1, wherein the first material comprises a metal Aspect 54. The apparatus of aspect 1, wherein the first material comprises a semiconductor Aspect 55. The apparatus of aspect 1, wherein the first material comprises a solid Aspect 56. The apparatus of aspect 1, wherein the first material comprises a fluid Aspect 57. The apparatus of aspect 56, wherein the first material comprises a liquid Aspect 58. The apparatus of aspect 56, wherein the first material comprises a solution, wherein the mobile charge carriers comprise positively or negatively charged ions located within the solution Aspect 59. The apparatus of aspect 56, wherein the first material comprises a gas Aspect 60. The apparatus of aspect 59 wherein the first material comprises a plasma Aspect 61. The apparatus of aspect 60 wherein the first material comprises a nonthermal plasma Aspect 62. The apparatus of aspect 60 wherein the first material comprises a thermal plasma Aspect 63. The apparatus of aspect 54, wherein the first material comprises an intrinsic semiconductor Aspect 64. The apparatus of aspect 54, wherein the first material comprises an n-type semiconductor Aspect 65. The apparatus of aspect 54, wherein the first material comprises a p-type semiconductor Aspect 66. The apparatus of aspect 2, wherein the second material comprises a metal Aspect 67. The apparatus of aspect 2, wherein the second material comprises a semiconductor Aspect 68. The apparatus of aspect 2, wherein the second material comprises a solid Aspect 69. The apparatus of aspect 2, wherein the second material comprises a fluid Aspect 70. The apparatus of aspect 69, wherein the second material comprises a liquid Aspect 71. The apparatus of aspect 69, wherein the second material comprises a solution, wherein the mobile charge carriers comprise positively or negatively charged ions located within the solution Aspect 72. The apparatus of aspect 69, wherein the second material comprises a gas Aspect 73. The apparatus of aspect 72 wherein the second material comprises a plasma Aspect 74. The apparatus of aspect 73 wherein the second material comprises a nonthermal plasma Aspect 75. The apparatus of aspect 73 wherein the second material comprises a thermal plasma Aspect 76. The apparatus of aspect 67, wherein the second material comprises an intrinsic semiconductor Aspect 77. The apparatus of aspect 67, wherein the second material comprises an n-type semiconductor Aspect 78. The apparatus of aspect 67, wherein the second material comprises a p-type semiconductor Aspect 79. The apparatus of any one of aspects 2 or 3, wherein the number of mobile charge carriers per unit volume within the first material is smaller than the number of mobile charge carriers per unit volume within the second material Aspect 80. The apparatus of aspect 79, wherein the mobile charge carriers are electrons Aspect 81. The apparatus of any one of aspects 2 or 3, wherein the electrical conductivity within the first material is smaller than the electrical conductivity in the second material Aspect 82. The apparatus of any one of aspects 2 or 3, wherein the behavior of the mobile charge carriers within the first material or the second material is substantially isothermal in an open circuit scenario Aspect 83. The apparatus of any one of aspects 2 or 3, wherein the behavior of the mobile charge carriers within the first material or the second material is not isothermal in an open circuit scenario Aspect 84. The apparatus of any one of aspects 2 or 3, wherein the absolute permittivity within the first material is smaller than the absolute permittivity within the second material Aspect 85. The apparatus of any one of aspects 2 or 3, wherein the absolute permittivity within the first material is larger than the absolute permittivity within the second material Aspect 86. The apparatus of aspect 84, wherein the body force generating apparatus comprises an electric field generating apparatus, wherein the electric field generating apparatus comprises a charge collection comprising charges fixed in space and time Aspect 87. The apparatus of aspect 85, wherein the body force generating apparatus comprises an electric field generating apparatus, wherein the electric field generating apparatus comprises a charge collection comprising an electrical conductor connected to a voltage supply Aspect 88. The apparatus of any one of aspects 2, 3, or 84, wherein the thickness of the region of accumulation of charge within the second material is larger than the thickness of the region of accumulation of charge within the first material Aspect 89. The apparatus of any one of aspects 86, 87, 88, wherein the material properties of the first material and the second material are identical with the exception of the difference in the permittivity Aspect 90. The apparatus of any one of aspects 2 or 3, wherein the first material and the second material comprise an n-type semiconductor, and wherein the number of donor atoms per unit volume is larger in the second material than in the first material Aspect 91. The apparatus of any one of aspects 2 or 3, wherein the first material and the second material comprise a p-type semiconductor, and wherein the number of acceptor atoms per unit volume is larger in the second material than in the first material Aspect 92. The apparatus of any one of aspects 2 or 3, wherein the first material and the second material comprise a p-type semiconductor, and wherein the number of acceptor atoms per unit volume is larger in the second material than in the first material Aspect 93. The apparatus of any one of aspects 2 or 3, wherein the number of atoms per unit volume is larger in the second material than in the first material Aspect 94. The apparatus of any one of aspects 2 or 3, wherein the number of atoms per unit volume is larger in the second material than in the first material Aspect 95. The apparatus of any one of aspects 2 or 3, wherein the first material comprises a semiconductor, and wherein the second material comprises a metal Aspect 96. The apparatus of any one of aspects 2 or 3, wherein the temperature in the first material is larger than the temperature in the second material Aspect 97. The apparatus of aspect 96, wherein the material properties of the first material and the second material are identical with the exception of the difference in the temperature Aspect 98. The apparatus of any one of aspects 2 or 3, wherein the temperature in the first material is smaller than the temperature in the second material Aspect 99. The apparatus of aspect 98, wherein the material properties of the first material and the second material are different, even with the exception of the difference in the temperature Aspect 100. The apparatus of any one of aspects 2 or 3, wherein the average charge carried by a mobile charge carrier in the first material is smaller than in the second material Aspect 101. The apparatus of aspect 100, wherein the material properties of the first material and the second material are identical with the exception of the difference in the average charge carried by a mobile charge carrier Aspect 102. The apparatus of any one of aspects 2 or 3, wherein the average charge carried by a mobile charge carrier in the first material is larger than in the second material Aspect 103. The apparatus of aspect 102, wherein the material properties of the first material and the second material are the different, even with the exception of the difference in the average charge carried by a mobile charge carrier Aspect 104. The apparatus of any one of aspects 2 or 3, wherein the mobile charge carrier is a quasiparticle Aspect 105. The apparatus of any one of aspects 2 or 3, wherein the mobile charge carrier is a virtual particle Aspect 106. The apparatus of any one of aspects 2 or 3, wherein the body force generating apparatus comprises an electric field generating apparatus, wherein the electric field strength at a boundary of the first material and within the first material is larger than the electric field strength at the boundary of the second material and within the second material, where the electrical field at the boundary forms a boundary condition for the electric field generated within a region of accumulation of charge within a material, and thereby determines the thickness of the region of accumulation of charge, amongst other parameters Aspect 107. The apparatus of aspect 106, wherein the properties of the first material and the second material are identical with the exception of the difference in electric field strength at a boundary of the first material and a boundary of the second material Aspect 108. The apparatus of aspect 107, wherein the electrical coupling between the second point in the first material and the second point in the second material comprises an electrical conductor Aspect 109. The apparatus of aspect 108, wherein the electrical conductor is a metal Aspect 110. The apparatus of any one of aspects 2 or 3, wherein the average effective mass of a mobile charge carrier within the first material is smaller than in the second material Aspect 111. The apparatus of any one of aspects 3, 10, or 11, wherein the electrical coupling comprises a superconductor Aspect 112. The apparatus of any one of aspects 3, 10, or 11, wherein the electrical coupling comprises a metal Aspect 113. The apparatus of any one of aspects 3, 10, or 11, wherein the electrical coupling comprises an electrical load Aspect 114. The apparatus of any one of aspects 3, 10, or 11, wherein the electrical coupling comprises a heat exchanger Aspect 115. The apparatus of aspect 113, wherein the electrical load comprises a resistor Aspect 116. The apparatus of aspect 113, wherein the electrical load comprises an electric motor Aspect 117. The apparatus of aspect 113, wherein the electrical load comprises a computer or microprocessor Aspect 118. The apparatus of aspect 113, wherein the electrical load comprises an electrical switch Aspect 119. The apparatus of aspect 114, wherein the heat exchanger is configured to deliver heat from the environment to the mobile charge carriers Aspect 119B. The apparatus of any one of aspects 2 or 3, wherein the average potential energy of mobile charge carriers at the first point in the first material is larger than the average potential energy of mobile charge carriers at the first point in the second material Aspect 119C. The apparatus of aspect 11, wherein mobile charge carriers can flow from the first point in the second material to the second point in the second material, and via the first electrical coupling from the second point in the second material to the second point in the first material, and from the second point in the first material to the first point in the first material, and via the second electrical coupling from the first point in the first material to the first point in the second material, thus completing the electrical circuit.

Aspect 119D. The apparatus of aspect 11, wherein an electrical current can flow from the first point in the first material to the second point in the first material, and via the first electrical coupling from the second point in the first material to the second point in the second material, and from the second point in the second material to the first point in the second material, and via the second electrical coupling from the first point in the second material to the first point in the first material, thus completing the electrical circuit.

Aspect 119E. The apparatus of any one of aspects 119C or 119D, wherein at least a portion of the electrical energy of the mobile charge carriers is provided by thermal energy of the mobile charge carriers Aspect 120. A system comprising two or more of the potential energy modification apparatuses of any one of aspects 1 to 119, and aspects 119B-E Aspect 121. A system comprising two or more of the potential energy modification apparatuses of aspect 2

Aspect 122. A system comprising two or more of the potential energy modification apparatuses of aspect 3

Aspect 123. The system of aspect 122, wherein the first point in the first material of a first potential energy modification apparatus is electrically coupled to the first point in the second material of a second potential energy modification apparatus Aspect 124. The system of aspect 120, wherein a first potential energy modification apparatus is electrically coupled in series with a second potential energy modification apparatus Aspect 125. The system of aspect 122, wherein the first point in the first material of a first potential energy modification apparatus is electrically coupled to the first point in the first material of a second potential energy modification apparatus, and wherein the first point in the second material of a first potential energy modification apparatus is electrically coupled to the first point in the second material of a second potential energy modification apparatus Aspect 126. The system of aspect 120, wherein a first potential energy modification apparatus is electrically coupled in parallel with a second potential energy modification apparatus Aspect 127. A method of potential energy modification, comprising: providing a potential energy modification apparatus or systems of any one of aspects 1 to 126, including aspects 119B-E.

Aspect 128. A method of potential energy modification, comprising: providing and operating a potential energy modification apparatus or system of any one of aspects 1 to 126, including aspects 119B-E, and selecting or providing the material properties of the materials of potential energy modification apparatus or system of any one of aspects 1 to 126, including aspects 119B-E Aspect 129. A method of potential energy modification, comprising: providing a body force generating apparatus; providing a first material, wherein the first material is electrically conducting, employing the body force generating apparatus to induce a region of accumulation of charge within the first material, wherein the first material comprises a first point and a second point Aspect 130. The method of aspect 129, wherein the method further comprises: providing a second material, wherein the second material is electrically conducting, wherein the body force generating apparatus can induce a region of accumulation of charge within the second material, wherein the second material comprises a first point and a second point Aspect 131. The method of aspect 130, wherein the method further comprises electrically coupling the second point in the second material to the second point in the first material Aspect 132. The method of aspect 131, wherein the method further comprises configuring the body force generating apparatus, such that the average potential energy of mobile charge carriers at the first point in the first material is different than the average potential energy of mobile charge carriers at the first point in the second material Aspect 133. The method of aspect 131, wherein the method further comprises selecting or providing the material properties of the first material relative to the material properties of the second material, such that the average potential energy of mobile charge carriers at the first point in the first material is different than the average potential energy of mobile charge carriers at the first point in the second material Aspect 134. The method of aspect 131, wherein the method further comprises electrically coupling the first point in the first material with the first point in the second material, thereby forming a closed electrical circuit Aspect 135. The method of aspect 133, wherein the selecting or providing of the material properties of the first material relative to the material properties of the second material comprises selecting or providing a first material with a larger number of mobile charge carriers per unit volume relative to the second material Aspect 136. The method of aspect 133, wherein the selecting or providing of the material properties of the first material relative to the material properties of the second material comprises selecting or providing a first material with a larger number of mobile charge carriers per unit volume relative to the second material Aspect 137. The method of aspect 133, wherein the selecting or providing of the material properties comprises selecting or providing a first material with a smaller electrical conductivity than the second material Aspect 138. The method of aspect 133, wherein the selecting or providing of the material properties comprises thermally coupling the first material to a first thermal reservoir, and the thermally coupling the second material to a second thermal reservoir, wherein the temperature of the first material is different to the temperature of the second material Aspect 139. The method of aspect 133, wherein the selecting or providing of the material properties comprises manipulating the temperature of the first material or the second material, such that the temperature of the first material is different to the temperature of the second material Aspect 140. The method of aspect 133, wherein the selecting or providing of the material properties comprises selecting of providing a first material with a different absolute permittivity than the second material Aspect 141. The method of aspect 131, wherein the method further comprises providing or manipulating the properties of the first material or the second material, or configuring the body force generating apparatus, such that the thickness of the region of accumulation of charge in the first material is larger than the thickness of the region of accumulation of charge in the second material Aspect 141B. The method of aspect 131, wherein the selecting or providing of the material properties comprises selecting of providing a first material with a different average charge per charge carrier than the second material Aspect 141C. The method of aspect 131, wherein the selecting or providing of the material properties comprises selecting of providing a first material with a different average effective mass per charge carrier than the second material Aspect 142. The method of aspect 134, wherein the method further comprises allowing electrical current to flow through the electrical circuit Aspect 143. The method of aspect 132, wherein the method further comprises including or providing an electrical load within or to the electrical circuit Aspect 144. The method of aspect 143, wherein the electrical load comprises an electric motor, a microprocessor, a computer, or a resistor Aspect 145. The method of aspect 129, wherein providing the body force generating apparatus comprises providing an electric field generating apparatus Aspect 146. The method of aspect 129, wherein providing the body force generating apparatus comprises providing an gravitational acceleration to the first material Aspect 147. The method of aspect 129, wherein providing the body force generating apparatus comprises providing an acceleration to the first material Aspect 148. The method of aspect 147, wherein providing the body force generating apparatus comprises providing an inertial acceleration to the first material Aspect 149. The method of aspect 147, wherein providing the body force generating apparatus comprises rotating the first material Aspect 150. The method of aspect 147, wherein providing the body force generating apparatus comprises accelerating the first material in an inertial frame Aspect 151. The method of aspect 147, wherein providing the body force generating apparatus comprises providing a magnetic field generating apparatus Aspect 152. The method of aspect 147, wherein the method further comprises including or providing a heat exchanger within or to the electrical circuit, wherein the heat exchanger is configured to deliver thermal energy to at least a portion of mobile charge carriers within the electrical circuit Aspect 153. The method of aspect 147, wherein the method further comprises including or providing an electrical switch within or to the electrical circuit Aspect 154. The method of aspect 129, wherein the first material can comprise a solid, liquid, gas, or plasma Aspect 155. The method of aspect 130, wherein the second material can comprise a solid, liquid, gas, or plasma Unless specified or clear from context, the term "or" is equivalent to "and/or" throughout this paper.

The embodiments and methods described in this paper are only meant to exemplify and illustrate the principles of the invention. This invention can be carried out in several different ways and is not limited to the examples, embodiments, arrangements, configurations, or methods of operation described in this paper or depicted in the drawings. This also applies to cases where just one embodiments is described or depicted. Those skilled in the art will be able to devise numerous alternative examples, embodiments, arrangements, configurations, or methods of operation, that, while not shown or described herein, embody the principles of the invention and thus are within its spirit and scope.

What is claimed is:

1. A potential energy modification apparatus, wherein the potential energy modification apparatus comprises:

a body force generating apparatus, wherein the body force generating apparatus is configured to apply a body force on charge carriers;

a first material, wherein the body force generating apparatus can be configured to induce a region of accumulation of charge within the first material, wherein the first material is electrically conducting, and wherein the first material comprises a first point and a second point and wherein the second point is located on a boundary of the region of accumulation of charge, and wherein the first region of charge has a non-zero electric field magnitude; and a second material, wherein the second material is electrically conducting, and wherein the second material comprises a first point and a second point;

wherein a relevant property of the second material is different relative to the same property in the first material, and wherein a steady electrical current can be made to flow in a closed circuit, wherein the closed circuit is formed when the second point in the first material is electrically coupled to the second point in the second material and the first point in the first material is electrically coupled to the first point in the second material.

2. The apparatus of claim 1, wherein the second point in the second material lies within a region of accumulation of charge.

3. The apparatus of claim 1, wherein the second point in the second material lies within a neutrally charged region.

4. The apparatus of claim 1, wherein the first point in the second material is electrically coupled to the first point in the first material.

5. The apparatus of claim 1, wherein an electrical coupling comprises an electrical conductor.

6. The apparatus of claim 1, wherein an electrical coupling comprises the transfer of electrical power between the two specified points.

7. The apparatus of claim 1, wherein the change in the potential energy of a mobile charge carrier moving through at least a portion of the region of accumulation of charge between the first point in the first material and the second point in the first material is larger in magnitude than the change in the potential energy of a mobile charge carrier moving through at least a portion of the region of accumulation of charge between the first point in the second material and the second point in the second material.

8. The apparatus of claim 1, wherein the thickness of the region of accumulation of charge within the second material is smaller than the thickness of the region of accumulation of charge within the first material.

9. The apparatus of claim 1, wherein at least a portion of the first material is electrically insulated from a second material.

10. The apparatus of claim 1, wherein the body force generating apparatus comprises an electric field generating apparatus, wherein at least a portion of the body force is electric in nature.

11. The apparatus of claim 1, wherein the body force generating apparatus comprises a gravitational field generating apparatus, and wherein at least a portion of the body force is gravitational in nature.

12. The apparatus of claim 1, wherein the body force generating apparatus comprises a magnetic field generating apparatus, and wherein at least a portion of the body force is magnetic in nature.

13. The apparatus of claim 1, wherein the body force generating apparatus comprises an electromagnetic field generating apparatus, and wherein at least a portion of the body force is electromagnetic in nature.

14. The apparatus of claim 1, wherein the body force generating apparatus comprises an accelerating apparatus, wherein the accelerating apparatus is configured to accelerate the first material or the second material in an inertial frame, and wherein at least a portion of the body force is inertial in nature.

15. The apparatus of claim 1, wherein the mobile charge carriers in the first material or second material comprise electrons.

16. The apparatus of claim 1, wherein the mobile charge carriers in the first material or second material comprise positively or negatively charged ions.

17. The apparatus of claim 1, wherein the first material or second material comprises a metal.

18. The apparatus of claim 1, wherein the first material or second material comprises a semiconductor.

19. The apparatus of claim 1, wherein the relevant properties comprise the nominal number of mobile charge carriers per unit volume within the material.

20. The apparatus of claim 1, wherein the relevant properties comprise the nominal electrical conductivity within the material.

21. The apparatus of claim 1, wherein the relevant properties comprise the absolute permittivity within the material.

22. The apparatus of claim 1, wherein the relevant properties comprise the number of atoms per unit volume.

23. The apparatus of claim 1, wherein the relevant properties comprise the number of donor atoms or acceptor atoms in a doped semiconductor per unit volume.

24. The apparatus of claim 1, wherein the relevant properties comprise the temperature of the material, and wherein at least a portion of current exceeds the current due to a Seebeck or Peltier effect.

25. The apparatus of claim 1, wherein the relevant properties comprise the average charge carried by a mobile charge carrier within the material.

26. The apparatus of claim 1, wherein relevant properties comprise the electric field strength at a boundary of the region of accumulation of charge within a material.

27. The apparatus of claim 1, wherein relevant properties comprise the average effective mass of a mobile charge carrier within a material.

28. The apparatus of claim 1, wherein an electrical coupling comprises an electrical load.

29. The apparatus of claim 1, wherein an electrical coupling comprises a heat exchanger.

30. The apparatus of claim 1, wherein the average potential energy of a mobile charge carrier at the first point in the first material is larger than the average potential energy of mobile charge carrier at the first point in the second material.

31. A system comprising two or more of the potential energy modification apparatuses of claim 1.

32. The apparatus of claim 1, wherein the set of relevant properties comprises a nominal number of mobile charge carriers per unit volume within the material, a nominal electrical conductivity within the material, an absolute permittivity within the material, a number of atoms per unit volume, a number of donor atoms or acceptor atoms in a doped semiconductor per unit volume, a temperature of the material, an average charge carried by a mobile charge carrier within the material, an electric field strength at a boundary of the region of accumulation of charge within a material, or average effective mass of a mobile charge carrier within a material.

33. A method of potential energy modification, comprising: providing a potential energy modification apparatus of claim 1.

34. The apparatus of claim 4, wherein the apparatus can be configured to comprise a closed electrical circuit, wherein mobile charge carriers can flow from the first point in the second material to the second point in the second material, and via the first electrical coupling from the second point in the second material to the second point in the first material, and from the second point in the first material to the first point in the first material, and via the second electrical coupling from the first point in the first material to the first point in the second material.

35. The apparatus of claim 28, wherein the electrical load comprises a computer or microprocessor, an electrical switch, an electrical motor, or an antenna.

36. The apparatus of claim 29, wherein the heat exchanger is configured to deliver heat from the environment to mobile charge carriers.

37. The system of claim 31, wherein a first potential energy modification apparatus is electrically coupled in series with a second potential energy modification apparatus.

38. A method of potential energy modification, comprising:
providing a body force generating apparatus;
providing a first material, wherein the first material is electrically conducting, and wherein the first material comprises a first point and a second point;
providing a second material, wherein the second material is electrically conducting, and wherein the first material comprises a first point and a second point;
employing the body force generating apparatus to induce a region of accumulation of charge at least within the first material, where the second point in the first material is located on the boundary of the region of accumulation of charge at which the electric field strength is non-zero;
electrically coupling the second point in the second material to the second point in the first material; and
configuring a relevant property of the second material to be different relative to same property in the first material, such that a steady electrical current can be made to flow when a closed circuit is formed, wherein the closed circuit is formed when the second point in the first material is electrically coupled to the second point in the second material and the first point in the first material is electrically coupled to the first point in the second material.

39. The method of claim 38, wherein the method further comprises electrically coupling the first point in the second material to the first point in the first material.

40. A system, comprising:
a first potential energy modification apparatus;
a second potential energy modification apparatus;
wherein the first potential energy modification apparatus is electrically coupled in parallel with the second potential energy modification apparatus, and wherein each of the first and second potential energy modification apparatus comprises:
a body force generating apparatus;
a first material, wherein the body force generating apparatus can be configured to induce a region of accumulation of charge within the first material, wherein the first material is electrically conducting, and wherein the first material comprises a first point and a second point; and
a second material, wherein the second material is electrically conducting, and wherein the second material comprises a first point and a second point;
wherein the second point in the second material is electrically coupled to the second point in the first material, and
wherein a relevant property of the second material is different relative to same property in the first material.

* * * * *